(12) United States Patent
Kurita et al.

(10) Patent No.: US 10,265,868 B2
(45) Date of Patent: Apr. 23, 2019

(54) TRANSFER ROBOT WITH SUBSTRATE COOLING

(75) Inventors: Shinichi Kurita, San Jose, CA (US); Makoto Inagawa, Palo Alto, CA (US); Takayuki Matsumoto, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 665 days.

(21) Appl. No.: 13/006,865

(22) Filed: Jan. 14, 2011

(65) Prior Publication Data

US 2011/0182699 A1 Jul. 28, 2011

Related U.S. Application Data

(60) Provisional application No. 61/297,472, filed on Jan. 22, 2010.

(51) Int. Cl.
| | |
|---|---|
| *H01L 21/67* | (2006.01) |
| *B25J 19/00* | (2006.01) |
| *B65G 49/06* | (2006.01) |
| *C03B 35/20* | (2006.01) |
| *H01L 21/677* | (2006.01) |

(52) U.S. Cl.
CPC ........ *B25J 19/0054* (2013.01); *B65G 49/061* (2013.01); *C03B 35/20* (2013.01); *H01L 21/67109* (2013.01); *H01L 21/67742* (2013.01); *Y02P 40/57* (2015.11)

(58) Field of Classification Search
CPC .............................................. H01L 21/67017
USPC .... 414/217, 751.1, 805, 935; 901/16, 17, 30
See application file for complete search history.

(56) References Cited

U.S. PATENT DOCUMENTS

| | | |
|---|---|---|
| 6,298,684 B1 | 10/2001 | Mitsuyoshi |
| 6,409,453 B1 | 6/2002 | Brodine et al. |
| 6,431,622 B1 | 8/2002 | Depeursinge et al. |

(Continued)

FOREIGN PATENT DOCUMENTS

| | | |
|---|---|---|
| JP | H07-231027 A | 8/1995 |
| JP | 11087463 A | 3/1999 |

(Continued)

OTHER PUBLICATIONS

International Search Report and Written Opinion dated Sep. 28, 2011 for International Application No. PCT/US2011/021286.

(Continued)

*Primary Examiner* — Saul Rodriguez
*Assistant Examiner* — Willie Berry, Jr.
(74) *Attorney, Agent, or Firm* — Patterson + Sheridan, LLP

(57) ABSTRACT

Embodiments of the present invention provide a transfer robot having a cooling plate attached thereto for cooling a substrate during transfer between a processing chamber and a load lock chamber. In one embodiment, the cooling plate is a single, large area cooling plate attached to the transfer robot beneath the substrate being transferred. In another embodiment, the cooling plate is an array of substrates attached to the transfer robot beneath the substrate being transferred. The cooling plate may include a conduit path for circulating a cooling fluid throughout the cooling plate. The cooling plate may have an upper surface with a high emissivity coating applied thereto.

20 Claims, 5 Drawing Sheets

(56) References Cited

U.S. PATENT DOCUMENTS

| | | | |
|---|---|---|---|
| 6,499,777 B1 * | 12/2002 | Wang | C30B 35/005 |
| | | | 118/728 |
| 6,602,797 B2 | 8/2003 | Kuribayashi et al. | |
| 6,634,686 B2 | 10/2003 | Hosokawa | |
| 7,467,916 B2 | 12/2008 | Yamagishi et al. | |
| 2005/0029243 A1 | 2/2005 | Kamata et al. | |
| 2007/0209593 A1 | 9/2007 | Aggarwal et al. | |
| 2008/0279656 A1 | 11/2008 | Uratani et al. | |
| 2009/0169343 A1 | 7/2009 | Tange | |
| 2010/0086380 A1 | 4/2010 | Kurita et al. | |

FOREIGN PATENT DOCUMENTS

| | | |
|---|---|---|
| JP | H1187463 A | 3/1999 |
| JP | H11168131 A | 6/1999 |
| JP | 176910 | 7/1999 |
| JP | 2001035902 A | 2/2001 |
| JP | 2002289669 A | 10/2002 |
| JP | 2002346965 A | 12/2002 |
| JP | 2005071992 A | 3/2005 |
| JP | 2008279538 A | 11/2008 |
| KR | 20020088555 A | 11/2002 |
| KR | 20090025400 A | 3/2009 |

OTHER PUBLICATIONS

English Translation of Chinese Office Action dated Sep. 21, 2014 for Application No. 2011800063804.

Office Action and English Translation of Chinese Office Action dated Jun. 9, 2015 for Application No. 2011800063804.

Office Action from Chinese Patent Application Serial No. 2011800006380.4 dated Dec. 30, 2016.

Office Action from Korean Patent Application No. 10-2012-7021716 dated Apr. 18, 2017.

Office Action from Japanese Patent Application No. 2012-550056 dated May 25, 2017.

Taiwan Office Action and English Translation of Office Action dated Jun. 1, 2015 for Taiwan Application No. 100101860.

Office Action and English Translation of Japan Office Action dated Dec. 28, 2015 for Japan Application No. 2012-550056.

* cited by examiner

TRANSFER ROBOT WITH SUBSTRATE COOLING

CROSS-REFERENCE TO RELATED APPLICATIONS

This application claims benefit of U.S. provisional patent application Ser. No. 61/297,472, filed Jan. 22, 2010, which is herein incorporated by reference.

BACKGROUND OF THE INVENTION

Field of the Invention

Embodiments of the present invention generally relate to a substrate transfer robot having a cooling plate attached thereto for cooling a substrate during transfer operations.

Description of the Related Art

Substrates, such as rectangular sheets of glass, plastic, or other material, are typically used in the manufacture of flat panel displays, solar devices, and other similar applications. Materials to form such devices are deposited onto the substrates by one or more processes within a processing system having one or more processing chambers. The substrates are typically introduced into the processing system through a load lock chamber, transferred to one or more processing chambers by a transfer robot for high temperature processing, and then transferred to a load lock chamber for cooling prior to removal from the processing system.

Substrate throughput within processing systems and facilities is traditionally a concern. Industry is always looking for ways to increase substrate throughput and lessen system and facility downtime. The faster a substrate can be processed, the more substrates can be processed per hour.

Therefore, there is a need for apparatus and methods of increasing substrate throughput in substrate processing systems.

SUMMARY OF THE INVENTION

In one embodiment of the present invention, a substrate transfer robot comprises an end effector, an upper assembly coupled to the end effector and operable to move the end effector linearly, a lower assembly coupled to the upper assembly and operable to rotate and vertically move the upper assembly, and one or more cooling plates attached to the upper assembly and positioned below the end effector.

In another embodiment, a substrate transfer robot comprises an end effector having a plural of horizontally extending fingers, an upper assembly coupled to the end effector and operable to move the end effector horizontally and one or more cooling plates attached to the upper assembly, the one or more cooling plates having a horizontal upper surface below and spaced apart from the end effector.

In yet another embodiment, a method for processing a substrate comprises processing a substrate in a processing chamber, removing the substrate from the processing chamber after processing the substrate on fingers of a transfer robot, cooling the substrate using one or more cooling plates attached to the transfer robot, and transferring the substrate to a load lock chamber using the transfer robot after cooling the substrate. The cooling plates are spaced from and below the fingers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a transfer robot having a cooling plate attached thereto for cooling a substrate during transfer between a processing chamber and a load lock chamber. In one embodiment, the cooling plate is a single, large area cooling plate attached to the transfer robot beneath the substrate being transferred. In another embodiment, the cooling plate is an array of substrates attached to the transfer robot beneath the substrate being transferred. In one embodiment, the cooling plate includes a conduit path for circulating a cooling fluid throughout the cooling plate. In one embodiment, the cooling plate has an upper surface with a high emissivity coating applied thereto.

Figure 1:
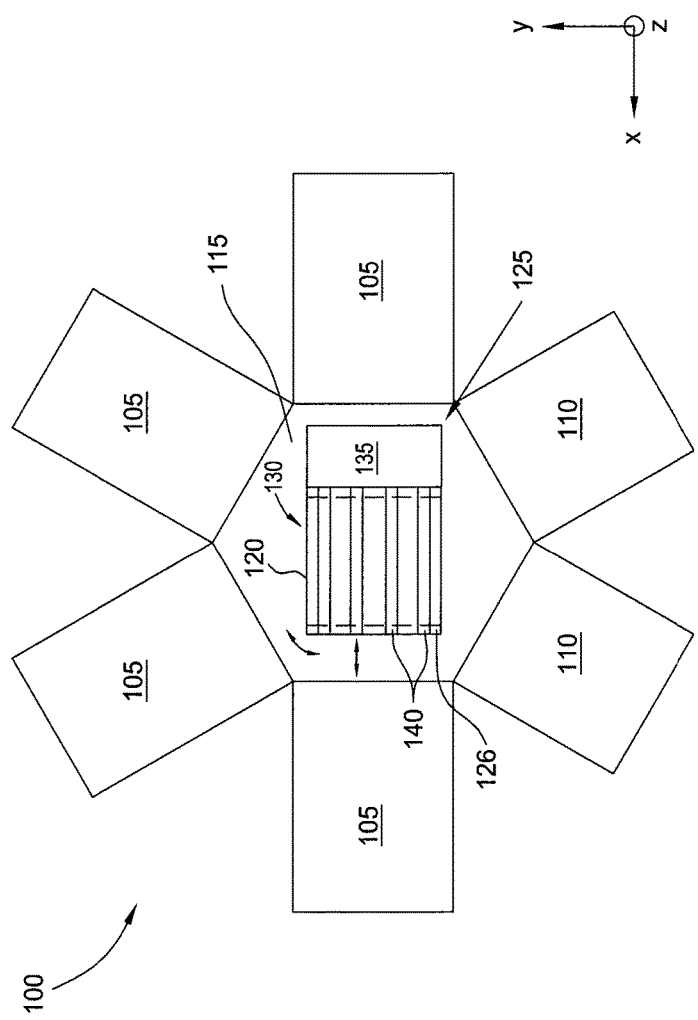
FIG. 1 is a plan view of a multi-chamber substrate processing system according to one embodiment of the present invention.

FIG. 1 is a plan view of a multi-chamber substrate processing system 100 suitable for the fabrication of thin-film transistors (TFT), organic light emitting diodes (OLEDS), and solar cell fabrication on flat media having one embodiment of a transfer robot 125 of the present invention. It is contemplated that the transfer robot 125 may be utilized in other processing systems. The system 100 includes a plurality of processing chambers 105 and one or more load lock chambers 110 positioned around a central transfer chamber 115. The processing chambers 105 may be configured to complete a number of high temperature processes to achieve a desired processing of flat media, such as a large area substrate 120, or other suitable substrate.

Positioned within the central transfer chamber 115 is the transfer robot 125 having an end effector 130. The end effector 130 is configured to be supported by and move relative to the remainder of the transfer robot 125 to transfer the substrate 120. The end effector 130 includes a wrist 135 and a plurality of fingers 140 extending horizontally therefrom. The fingers 140 are adapted to support the substrate 120 thereon. In one embodiment, the transfer robot 125 is configured to rotate the end effector 130 about a central axis and/or move the end effector 130 linearly in a vertical direction. The end effector 130 is configured to move linearly in a horizontal direction by the transfer robot 125 to extend into and retract from the chambers 105, 110 surrounding the transfer chamber 115 to facilitate substrate transfer between the chambers 105, 110 and 115.

The central transfer chamber 115 is held at a reduced pressure (i.e., vacuum) during processing of substrates. The pressure in the central transfer chamber 115 may be maintained at a pressure lower than ambient pressure (i.e. pressure outside the system 100). The pressure maintained within the central transfer chamber 115 may be substantially equal to the pressure within the processing chambers 105 and/or load lock chambers 110.

During substrate processing, the substrate 120 is processed at elevated temperatures within one or more of the processing chambers 105. The substrate 120 is then transferred to one of the load lock chambers 110 by the transfer robot 125 for cooling before being removed from the processing system 100. In order to improve throughput of the processing system, embodiments of the present invention provide one or more cooling plates 126 attached to the transfer robot 125 below the end effector 130 for cooling the substrate 120 during transfer from one of the processing chambers 105 to one of the load lock chambers 110. As a result, the time required to cool the substrate 120 in the load lock chamber 110 is significantly reduced and throughput of the processing system 100 is increased.

Figure 2:
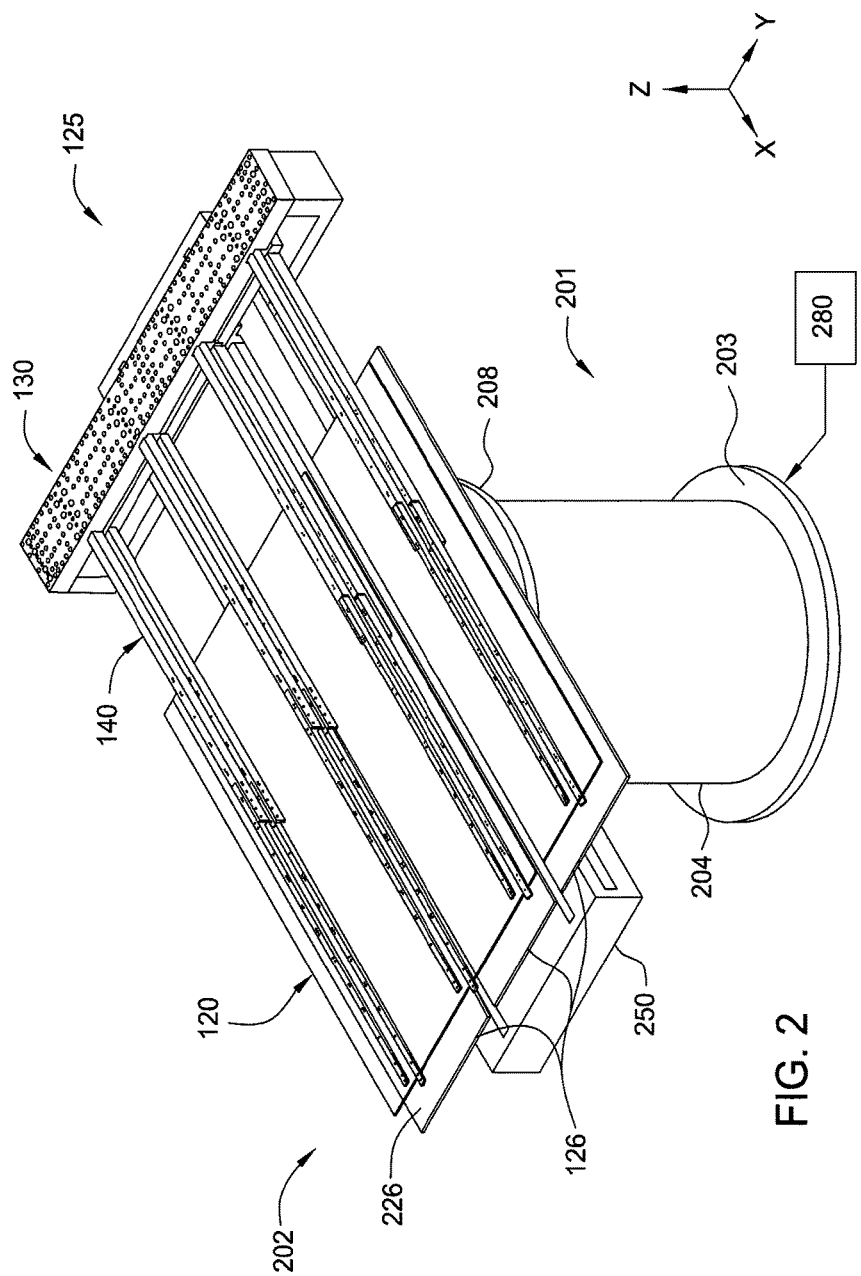
FIG. 2 is a schematic, isometric view of a transfer robot according to one embodiment of the present invention.

FIG. 2 is a schematic, isometric view of the transfer robot 125 according to one embodiment of the present invention. The transfer robot 125 includes a lower assembly 201 coupled to an upper assembly 202. The lower assembly 201 is operable to rotate the end effector 130 about a central axis and move vertically (Z direction) along the central axis. The upper assembly 202 operable to move the end effector 130 laterally or horizontally (X direction) relative to the lower assembly 201. The transfer robot 125 may include a fixed base 203 that is fixed relative to the transfer chamber 115 (FIG. 1) housing a rotational drive system (not shown) coupled to the transfer robot 125 to provide rotational movement to the end effector 130.

The lower assembly 201 includes a lift assembly 204 coupled to the rotational drive system (not shown). The lift assembly 204 may be any suitable lift assembly capable of raising and lowering the upper assembly 202. One embodiment of a lift assembly 204 that may be used comprises a scissor type lift assembly as disclosed in U.S. patent application Ser. No. 12/247,135 filed on Oct. 7, 2008, which is herein incorporated by reference.

The lift assembly 204 is coupled to and supports a platform 208, which, in turn, provides a mounting surface for the upper assembly 202. The upper assembly 202 may include a base 250 coupled to the end effector 130. The base 250 includes a linear actuator (not shown) which moves the end effector 130 relative to the lower assembly 201 in a horizontal plane.

Figure 5:
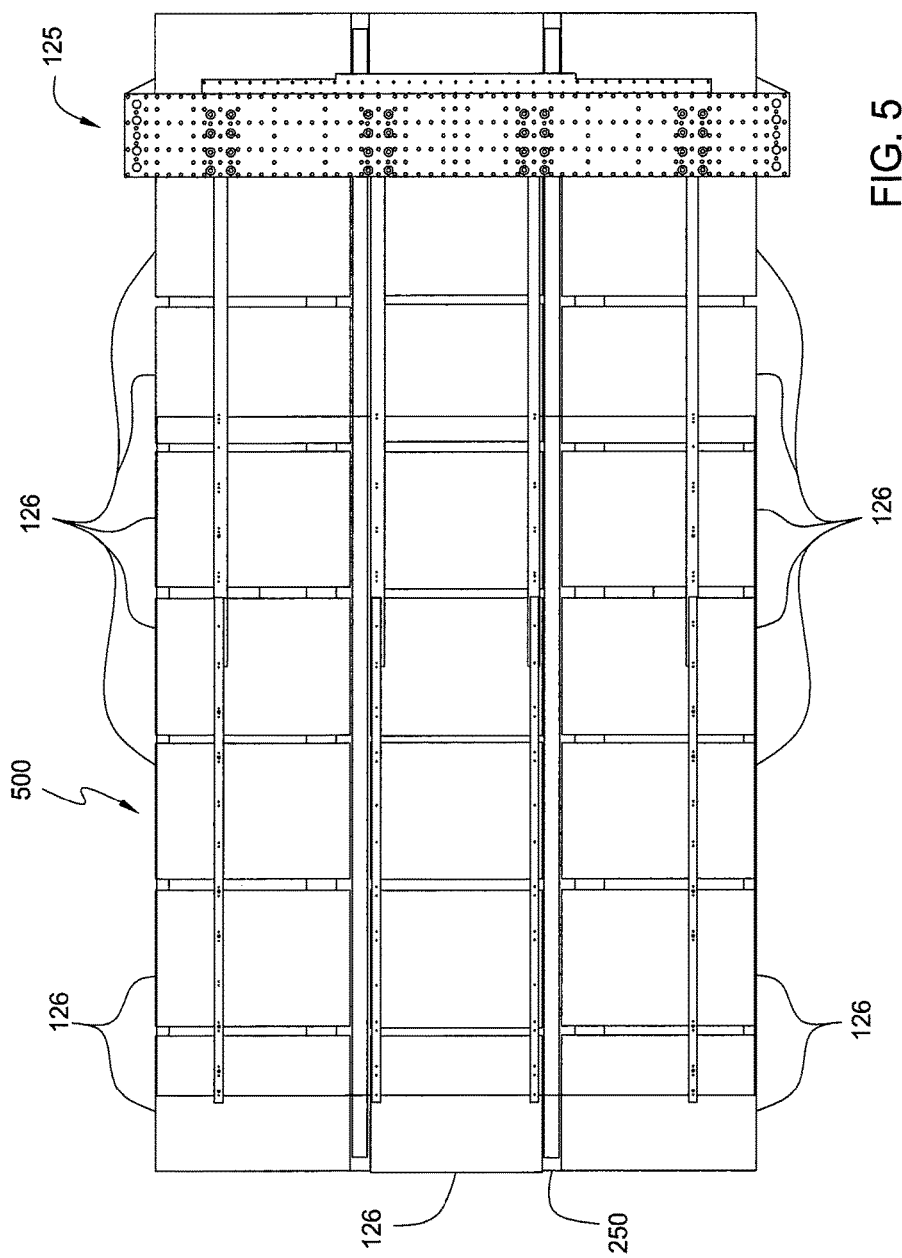
FIG. 5 is a schematic, plan view of the transfer robot according to one embodiment of the present invention.

One or more cooling plates 126 may be mounted to the base 250 below the fingers 140 of the end effector 130. The one or more cooling plates 126 may be made of aluminum or stainless steel. In one embodiment, the upper assembly 202 includes a single, large cooling plate 126, as shown in FIG. 2. In other embodiments, the upper assembly 202 includes a plurality of cooling plates 126, as subsequently shown and described with respect to FIG. 5. The one or more cooling plates 126 may be mounted to the base 250 via suitable means, such as by welding or using mechanical fastening members. The one or more cooling plates 126 may have a substantially planar horizontal upper surface 226, which has an orientation substantially parallel to, and spaced apart from the fingers 140 of the end effector 130. In one embodiment, the top plan area of the one or more cooling plates 126 below the substrate 120 has approximately the same plan area as the substrate 120, as depicted in FIG. 2. In another embodiment, the top plan area of the one or more cooling plates 126 below the substrate 120 is greater than the plan area of the substrate 120 as depicted in FIG. 5. For example, the one or more cooling plates 126 may exceed 0.16 square meters. The width of the one or more cooling plates 126 may also exceed the width of the upper assembly 202.

In one embodiment, each cooling plate 126 has a high emissivity surface to increase the rate of cooling the substrate 120 (FIG. 1) positioned on the fingers 140 of the end effector 130 during substrate transfer processes. In one embodiment, the upper surface 226 of the one or more cooling plates 126 is coated, anodized, painted, or bead blasted in order to provide a high emissivity surface.

In another embodiment, a high emissivity coating, such as an aluminum vacuum coating, is applied to the upper surface 226 of each of the cooling plates 126. The high emissivity coating may be directly coated onto the upper surface 226 of each cooling plate 126, or the coating may be applied by a high emissivity aluminum foil with a pressure sensitive adhesive on the surface that contacts the one or more cooling plates 126. The high emissivity aluminum foil may be applied to the upper surface 226 of the one or more cooling plates 126 without the need for surface treatments, such as anodization, painting, or bead blasting.

In one embodiment, the high emissivity coating has an emissivity of between about 0.7 and about 0.9. The high emissivity coating may have a thickness of between about 0.3 micrometers and about 14 micrometers. The high emissivity coating may include multiple layers. A suitable high emissivity coating may be purchased from Acktar Advanced Coatings, LTD, Israel.

A cooling fluid, provided by a cooling fluid source 280, may be circulated throughout the one or more cooling plates 126. One or more conduits (not shown) may be provided in the lower assembly 201 to facilitate flow of the cooling fluid from a cooling fluid source 280 and through the one or more cooling plates 126. The cooling fluid may be water, deionized (DI) water, ethylene glycol, nitrogen, helium, or another fluid used as a heat exchange medium.

Figure 3:
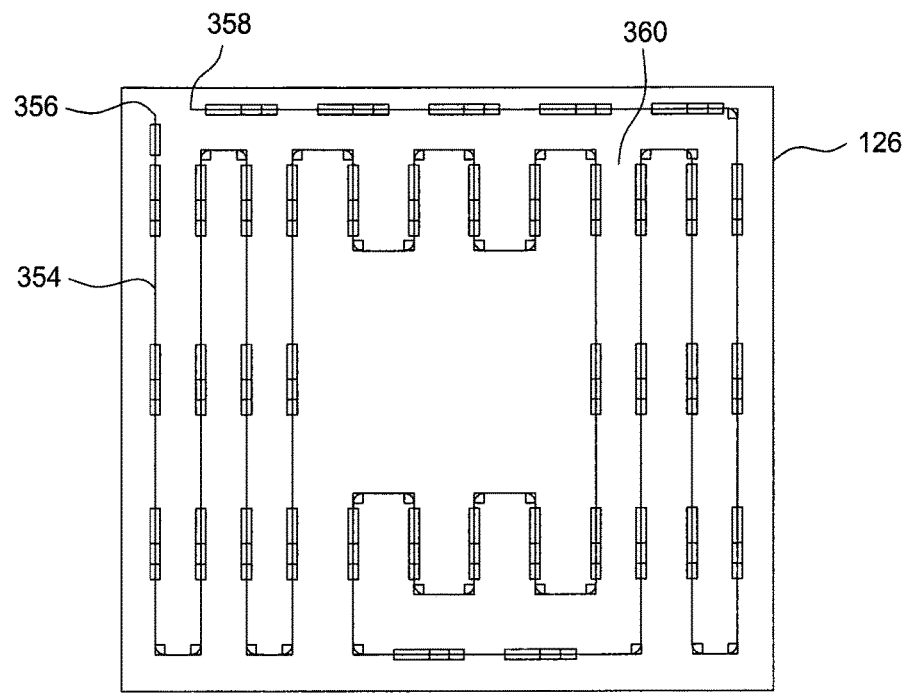
FIG. 3 is a schematic, bottom view of a cooling plate according to one embodiment of the present invention.

FIG. 3 is a schematic, bottom view of the cooling plate 126 according to one embodiment of the present invention. A fluid conduit 354 having an input port 356 and an output port 358 is illustrated disposed in a serpentine or tortuous path along the bottom surface 360 of the cooling plate 126. The cooling fluid source 280 (FIG. 2), as previously described, is attached to the input port 356, and the fluid is circulated through the conduit 354. The cooling fluid then exits the output port 358, and either returns to the cooling fluid source 280 (FIG. 2) or an exhaust source (not shown).

In one embodiment, the conduit 354 is positioned in a continuous groove formed in the bottom surface 360 of the cooling plate 126, which defines the desired path that the fluid is to take. After the groove is formed, a tube comprising the conduit 354 bent to conform to the path of the groove, is secured within the groove. A plurality of retaining plates or strips may be disposed at discreet positions spaced along the length of the tube to retain the tube within the groove and in thermal transfer contact with the bottom surface 360 of the cooling plate 126. Alternatively, the tube comprising the conduit 354 may be attached to the bottom surface 360, or the top surface (not shown), of the cooling plate 126 by suitable means, such as welding or clamping, without the use of grooves in the cooling plate 126. In another embodiment, the groove may be formed in the top surface (not shown) of the cooling plate 126. After placing and retaining the conduit 354 within the groove, the high emissivity foil may be applied to the top surface of the cooling plate 126 covering the conduit 354, as previously described.

Figure 4:
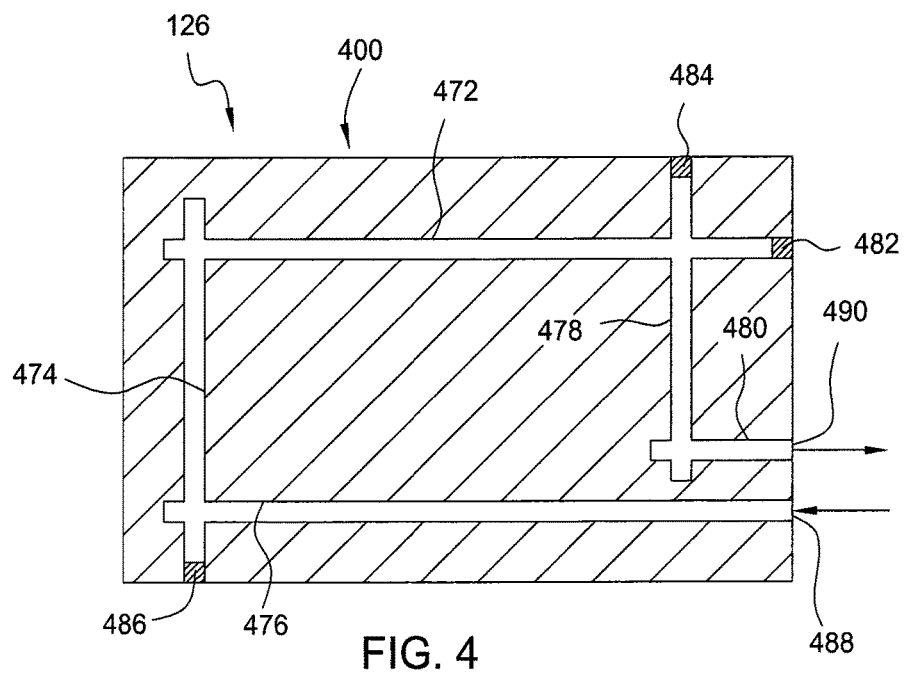
FIG. 4 is a schematic, sectional view of a cooling plate according to another embodiment of the present invention.

FIG. 4 is a schematic, sectional view of a cooling plate 126 according to another embodiment of the present invention. The cooling plate 126 has a continuous fluid conduit 400 that may include a plurality of drilled bores 472 through-formed in the body of the cooling plate 126. As illustrated, the bore 472 intersects with bores 474 and 478. The bore 474 intersects with the bore 476, and the bore 478 intersects with the bore 480. The entry point of the bore 472 is sealed with a plug 482, as shown. The entry point of the bore 478 is sealed with a plug 484, while the entry point of the bore 474 is sealed with a plug 486. The entry point for the bore 476 forms an inlet port 488, while the entry point of the bore 480 forms an outlet port 490 for the continuous fluid conduit 400 formed by the interconnected bores 472, 474, 476, 478, 480. Although a single continuous drilled fluid conduit 400 formed by the bores is illustrated in FIG. 4, it should be understood that a plurality of parallel fluid conduits may be formed by drilling through the length or width of the cooling plate 126. Alternatively, a plurality of other bores interconnecting the bores illustrated in FIG. 4 may be formed to provide a plurality of serially connected fluid conduits, which may form a continuous or tortuous path through the body of the cooling plate 126.

FIG. 5 is a schematic, plan view of the transfer robot 125 according to one embodiment of the present invention. As shown, the one or more cooling plates 126 are a plurality of cooling plates 126 configured in an array 500 and attached to the base 250 of the transfer robot 125. The array 500 may be rectangular or have another geometry. In one embodiment, each of the cooling plates 126 in the array 500 is formed in accordance with the description of FIG. 3 or FIG. 4. The conduit from each cooling plate 126 may then be serially coupled, such as by threaded or welded couplings, such that the array 500 of cooling plates 126 functions as a single cooling plate with a continuous fluid conduit disposed for circulating a cooling fluid throughout.

Figure 6:
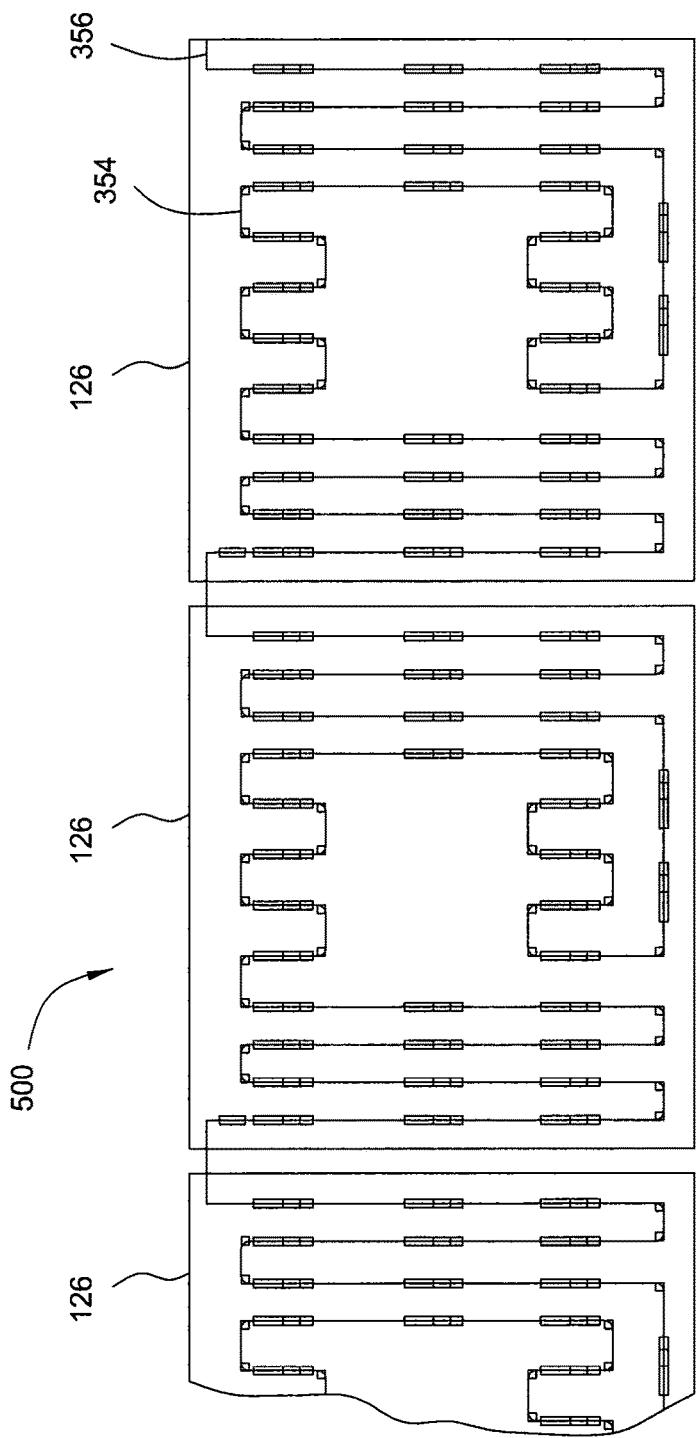
FIG. 6 is a partial bottom view of an array of cooling plates.

In another embodiment, each of the cooling plates 126 in the array 500 is individually attached to the base 250 of the transfer robot 125. The conduit 354 may then be attached to the surface of the array 500 of cooling plates 126 as described with respect to a single, large cooling plate 126 in FIG. 3 and as illustrated in the partial bottom view of the array 500 depicted in FIG. 6. The conduit 354 may be positioned in thermal contact with the array 500 of cooling plates 126 and attached to the surface thereof, or the conduit 354 may be placed into pre-formed grooves within the array 500 of cooling plates 126 as described with respect to a single, large cooling plate 126 in FIG. 3. In either embodiment, the array 500 of cooling plates 126 functions as a single cooling plate with a continuous fluid conduit disposed for circulating a cooling fluid throughout.

In another embodiment, the each of the cooling plates 126 in the array 500 is formed in accordance with the description of FIG. 4. The conduit from each cooling plate 126 may then be serially coupled, such as by threaded or welded couplings, such that the array 500 of cooling plates 126 functions as a single cooling plate with a continuous fluid conduit disposed for circulating a cooling fluid throughout similar to that shown in FIG. 6, but constructed within the individual cooling plates 126, with the outlet port 490 of one cooling plate 126 coupled to the inlet port 488 of the adjacent cooling plate 126.

In each of the aforementioned embodiments described with respect to FIG. 5, a high emissivity coating may be applied either to the individual cooling plates 126 or over the entire array 500 of cooling plates, as previously described.

Embodiments described herein provide a transfer robot having a cooling plate attached thereto for cooling a substrate during transfer between a processing chamber and a load lock chamber. Cooling the substrate during an operation already provided, i.e., substrate transfer, allows less time to be used in cooling the substrate in the load lock chamber prior to removal from the processing system. Thus, throughput of the processing system is increased without the addition of any additional processing operations.

While the foregoing is directed to embodiments of the present invention, other and further embodiments of the invention may be devised without departing from the basic scope thereof, and the scope thereof is determined by the claims that follow.

The invention claimed is:

1. A substrate transfer robot, comprising:
a lower assembly comprising:
a lift assembly operable to rotate and move vertically;
a fixed base supporting the lift assembly; and
a platform disposed on the lift assembly, above and opposite the fixed base; and
an upper assembly comprising:
an end effector configured to support a substrate having a predefined plan area;
an upper base disposed on the platform of the lower assembly, the upper base having a width and coupled to the end effector and operable to move the end effector linearly; and
one or more cooling plates positioned above the upper base and below the end effector, wherein the one or more cooling plates are open directly to the end effector, the one or more cooling plates having a plate width and plate length establishing a plan area substantially similar to the plan area of the substrate and configured to cool the substrate, and wherein the plate width is larger than the width of the upper base.

2. The substrate transfer robot of claim 1, wherein one or more fluid conduits are in thermal contact with the one or more cooling plates for circulating a cooling fluid therethrough.

3. The substrate transfer robot of claim 2, wherein the one or more fluid conduits are disposed within the one or more cooling plates.

4. The substrate transfer robot of claim 2, wherein the one or more cooling plates comprise a plurality of cooling plates arranged in a rectangular array.

5. The substrate transfer robot of claim 4, wherein the plurality of cooling plates are fluidly coupled together.

6. The substrate transfer robot of claim 1, wherein the one or more cooling plates have a surface with a high emissivity coating.

7. The substrate transfer robot of claim 6, wherein the high emissivity coating has an emissivity of between about 0.7 and about 0.9.

8. The substrate transfer robot of claim 6, wherein the high emissivity coating comprises an aluminum foil.

9. The substrate transfer robot of claim 6, wherein the high emissivity coating has a thickness between about 0.3 micrometers and about 14 micrometers.

10. A substrate transfer robot, comprising:
an upper assembly comprising:
an end effector having a plurality of horizontally extending fingers configured to support a substrate having a predetermined plan area;
a base coupled to the end effector, the base having a width and operable to move the end effector horizontally; and
one or more cooling plates above the base and mounted thereto, the one or more cooling plates having a horizontal upper surface directly exposed to the end effector, wherein the horizontal upper surface is below and spaced apart from the end effector without any intervening features therebetween, and wherein the one or more cooling plates have an overall width greater than the width of the base.

11. The substrate transfer robot of claim 10, wherein one or more fluid conduits are in thermal contact with the one or more cooling plates for circulating a cooling fluid therethrough.

12. The substrate transfer robot of claim 11, wherein the one or more cooling plates comprise a plurality of cooling plates arranged in a rectangular array.

13. The substrate transfer robot of claim 12, wherein the plurality of cooling plates are fluidly coupled together.

14. The substrate transfer robot of claim 11, wherein the one or more cooling plates have a surface with a high emissivity coating.

15. The substrate transfer robot of claim 14, wherein the high emissivity coating has an emissivity between about 0.7 and about 0.9.

16. The substrate transfer robot of claim 14, wherein the high emissivity coating comprises an aluminum foil.

17. The substrate transfer robot of claim 14, wherein the high emissivity coating has a thickness between about 0.3 microns and about 14 microns.

18. A method for processing a substrate, comprising:
processing a substrate in a processing chamber;
removing the substrate from the processing chamber after processing the substrate on fingers of a transfer robot;
cooling the substrate using one or more cooling plates attached to the transfer robot disposed between the fingers and a rail supporting the horizontal movement of the fingers, wherein the cooling plates have a width greater than a width of the fingers and the cooling pates have a plan area substantially similar to a plan area of the substrate, are directly exposed to the fingers without any intervening structures, and are spaced from and below the fingers; and
transferring the substrate to a load lock chamber using the transfer robot after cooling the substrate.

19. The method of claim 18, wherein cooling the substrate using one or more cooling plates comprises flowing coolant through a conduit routed through a plurality of cooling plates that comprise the one or more cooling plates.

20. The method of claim 18, wherein a top surface of the one or more cooling plates is covered by a high emissivity surface.

* * * * *